Sept. 19, 1967 TAKEO SEKI ETAL 3,342,650

METHOD OF MAKING SEMICONDUCTOR DEVICES BY DOUBLE MASKING

Filed Feb. 2, 1965 2 Sheets-Sheet 1

INVENTOR.
Takeo Seki
Shoji Tauchi
Takeshi Takagi

INVENTOR.
Takeo Seki
Shoji Tauchi
Takeshi Takagi

United States Patent Office 3,342,650
Patented Sept. 19, 1967

3,342,650
METHOD OF MAKING SEMICONDUCTOR DEVICES BY DOUBLE MASKING

Takeo Seki and Shoji Tauchi, Kokubunji-shi, and Takeshi Takagi, Musashino-shi, Tokyo-to, Japan, assignors to Kabushiki Kaisha Hitachi Seisakusho, Tokyo-to, Japan, a joint-stock company of Japan Filed Feb. 2, 1965, Ser. No. 429,865
Claims priority, application Japan, Feb. 10, 1964, 39/6,717
7 Claims. (Cl. 148—187)

Figure 1A:
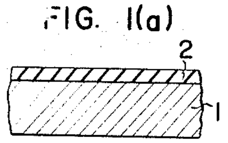

This invention relates to a novel method of preparing semiconductor devices of finely delicate construction starting from a semiconductor material such as silicon, germanium or a compound semiconductor and by using an insulator film mask.

It is a common practice to form a diffused region of a predetermined conductivity type in a semiconductor substrate by a process comprising the steps of covering the surface of the semiconductor with an insulator coating or film, removing portions of the insulator film to form perforations terminating at the semiconductor surface, and diffusing an impurity of a predetermined conductivity type through said perforations. For the insulator coating, an oxide of a semiconductor material, particularly an oxide of silicon, is widely used.

For said impurity, phosphorous, antimony, arsenic boron and the like are commonly utilized and are introduced from a vapor phase or a solid phase. The impurity introduced through the perforations formed in the insulator coating will diffuse into the semiconductor body to form a diffused region, and the extent of diffusion in the lateral direction will be limited by the dimension of the perforations in the insulator coating. It is well known in the art that gallium cannot be shielded by a film of silicon dioxide. An insulator coating is also used to limit the contact area between an electrical conductor and the semiconductor surface when the electrical conductor is to be connected to the semiconductor surface through said perforation extending through the insulator coating.

The construction of a semiconductor element prepared by selectively diffusing an impurity through a mask consisting of an insulator coating or film by a process as mentioned hereinabove, is known as "planar structure." To form this planar structure, a mask comprising an insulator film having perforations which terminate at the surface of a semiconductor is used to diffuse an impurity of different conductivity type from that of the semiconductor substrate to form a diffused region. Thereafter, a second insulator film is formed to cover said perforations, and second perforations having smaller diameters than those of the first mentioned perforations are formed to diffuse therethrough another impurity having different conductivity type from said diffused region to form a second diffused region. Alternatively, terminal conductors are connected through the second perforations. Perforations through the insulator coating covering the semiconductor surface can be formed by the well known photo-etching technique.

In forming the second perforations through the insulator film, it is necessary to closely control the positions thereof, and it will be clear that as the number of process steps required to form perforations through the insulator film is increased, the difficulty of closely controlling the positions of the perforations will be increased. Thus, for example, to prepare transistors of double diffusion type, a total of three photo-etching steps are required. This process is known as a "mask aligning operation" because it includes a step of aligning a pattern on the mask with a pattern formed on a semiconductor wafer by manipulating a photographic negative. Thus, three mask aligning operations are required. In order to prepare ultra-high-frequency transistors, these mask aligning operations must be carried out with an accuracy of from 2 to 3 microns, and since an increase in the number of mask aligning operations results in an increase in the probability of deviation between the mask pattern and the pattern on the semiconductor substrate, the number of satisfactory transistors formed on a single wafer, will be decreased, thus decreasing the yield of satisfactory products below several percents. It is also to be noted that extremely high quality and expensive apparatus are required to perform such mask aligning operations with high accuracy. Moreover, there are many engineering problems to be solved. For example, the masks themselves are expensive, and the mask aligning operations require much time.

It is therefore an object of this invention to decrease the number of troublesome mask aligning operations, thereby decreasing the number of defective products.

Another object of this invention is to provide a method of preparing semiconductor devices, which can be controlled very accurately.

A further object of this invention is to provide semiconductor devices wherein pn junctions reaching their surfaces are permanently protected by insulator film, from the time of their manufacture.

Yet another object of this invention is to provide semiconductor devices of a multiple diffusion type having finely delicate construction.

This invention contemplates the attainment of all of said objects and is characterized by the steps of successively covering the surface of a semiconductor body with two kinds of insulator films having the same shielding effect for the impurity but having different etching speeds, thereby to decrease the required number of mask aligning operations by utilizing the difference in the etching speeds. According to one form of this invention, one of the insulator films is comprised of a film of $SiO_2$ obtained by oxidizing the surface of silicon at an elevated temperature and the other insulator film is comprised of a film of $SiO_2$ produced by decomposing organosilanes.

The accompanying Table 1 illustrates the difference in the etching speeds of various oxide films, each value therein representing the time in minutes required to remove completely the respective films each having a thickness of 0.5 micron by a mixture etchant comprising ammonium fluoride and hydrofluoric acid (mixing ratio being 6:1). The insulator films shown in Table 1 were formed by the following processes.

(1) Oxidation process at elevated temperatures: The surface of an ordinary silicon substrate heated to an elevated temperature within a range from 1000 to 1300° C. is subjected to an oxidizing atmosphere such as steam or wet oxygen to grow $SiO_2$ from the silicon substrate. For example, a silicon body heated to a temperature of 1200° C. is maintained in a steam atmosphere at normal pressure for 30 minutes to form a film of $SiO_2$ having a thickness of about 5000 angstroms.

(2) Pyrolysis of organooxysilanes: Generally, organooxysilanes undergo pyrolysis at a temperature between 600° C. and 800° C. to form $SiO_2$. For example, when tetraethoxysilane vapor is introduced into a furnace heated to a temperature of 725° C. together with an inert carrier gas such as argon, a film of $SiO_2$ of a thickness of about 4000 angstroms can be deposited on the surface of a substrate.

(3) A process wherein lead is vapor deposited upon a layer of $SiO_2$ and then oxidized: In this process lead is vapor deposited to a thickness of about 500 angstroms upon the layer of $SiO_2$ obtained by the above process (2), and then the coated body is heated in an oxygen-containing atmosphere at a temperature of about 600° C. to obtain a glassy layer containing lead. Instead of lead, PbO may be vapor deposited and then subjected to a heat treatment.

(4) A process wherein lead is vapor deposited upon a silicon substrate and is then subjected to a heat treatment: As has been discussed in connection with process (1), while oxidation of silicon ordinarily proceeds at a temperature above 900° C. under normal pressure, if lead is vapor deposited directly upon a silicon substrate and is then heat treated in an oxydizing atmosphere, it will be possible to oxidize the surface of the silicon substrate at a relatively low temperature of about 600° C.

TABLE 1

| Process of forming oxide film (thickness 0.5μ): | Time required to etch a film of 0.5μ thickness (minutes) |
|---|---|
| (1) Oxidation process at elevated temperatures | 8–10 |
| (2) Pyrolysis of organooxysilanes | 3 |
| (3) Process wherein lead is vapor deposited upon $SiO_2$ and is then heat treated | 0.3 |
| (4) Process wherein lead is vapor deposited directly upon a silicon substrate and is then heat treated | 0.3 |

As can be observed from Table 1, the etching speed of oxide films varies greatly depending upon their forming process. This invention contemplates the application of such phenomena to the preparation of semiconductor devices thereby to provide a novel and effective process for producing them.

Figure 1B:
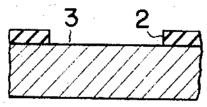
Figure 1C:
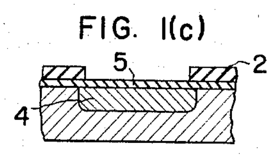
Figure 1D:
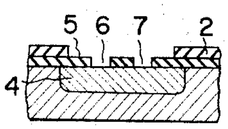
Figure 1E:
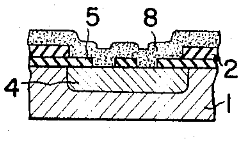
Figure 1F:
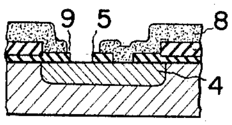
Figure 1G:
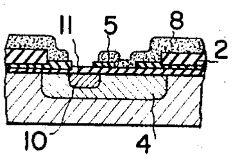
Figure 1H:
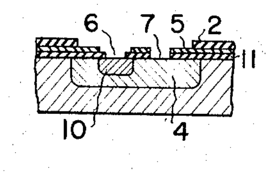
Figure 1I:
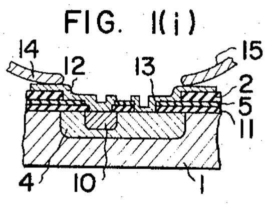
Figure 2A:
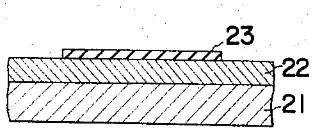
Figure 2B:
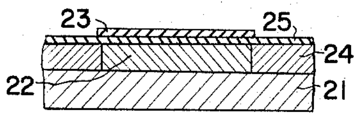
Figure 2C:
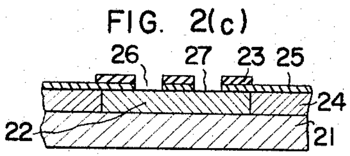
Figure 2D:
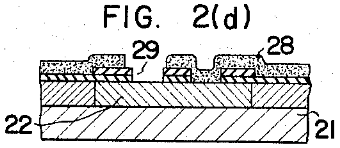
Figure 2E:
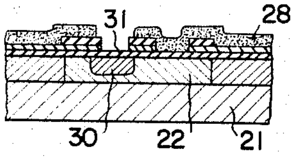
Figure 2F:
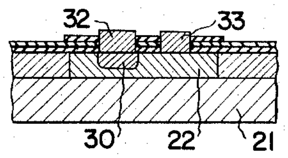
Figure 3A:
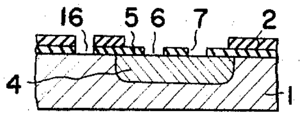
Figure 3B:
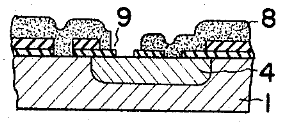
Figure 3C:
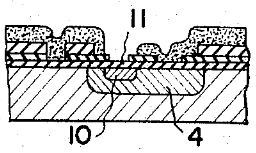
Figure 3D:
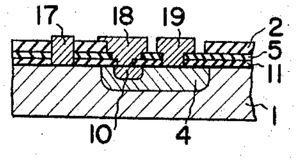
Figure 4A:
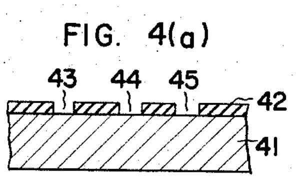
Figure 4B:
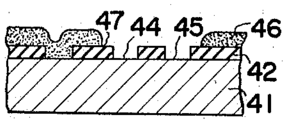
Figure 4C:
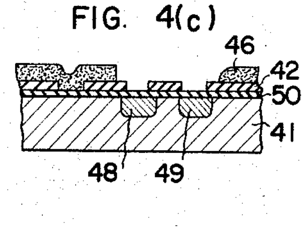
Figure 4D:
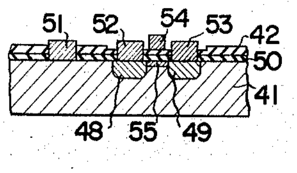

This invention will be more fully understood from the following detailed description taken in connection with the accompanying drawings, in which like parts are designated by like reference characters, and in which:

FIGS. 1 to 4, inclusive, respectively illustrate a series of sectional views of various steps of different embodiments of this invention.

It should be understood that the drawings are not to scale and certain dimensions are exaggerated for clarity.

*Example 1*

FIG. 1 illustrates one embodiment of this invention, various steps included therein being as follows:

(a) An n-type silicon wafer 1 having a resistivity of about 1 ohm-cm. was prepared and treated in a steam atmosphere of 1200° C. to grow a layer 2 of $SiO_2$ of a thickness of approximately 5000 angstroms on the surface of the wafer.

(b) A portion of the $SiO_2$ layer 2 was removed by a well-known photo-etching process to form an opening or perforation 3 terminating at the surface of the wafer 1.

(c) A p-type impurity, boron, for example, was introduced from a vapor phase through said perforation 3 to form a p-type diffused region 4. Diffusion of the impurity is usually carried out in an oxidizing atmosphere, otherwise erosion of the silicon surface would result. Since diffusion of the impurity was effected in an oxidizing atmosphere at a temperature of about 1200° C., the entire surface of the silicon wafer was oxidized to form a thin layer of $SiO_2$ of a thickness of about 3000 angstroms.

(d) By a well-known photo-etching process, two perforation 6 and 7 reaching said diffused region 4 were formed through the layer 5 of $SiO_2$ which was formed in said perforation 3, the perforation 6 serving to diffuse an n-type impurity, and the perforation 7 serving to connect a contact to the region 4 in the subsequent stage of fabrication. It should be particularly noticed that perforations 6 and 7 are formed simultaneously. Thus, at this stage of the prior art process, only the perforation is formed, and, subsequent to the diffusion of the impurity through the perforation 6, the perforation 7 is formed, whereas, according to this invention, as these two perforations are formed simultaneously, the number of mask aligning operations can be reduced.

(e) A layer or coating 8 which can be etched at a higher speed than the layers 2 and 5 of $SiO_2$ and is effective to shield diffusion of an active impurity was deposited upon said layers 2 and 5 of $SiO_2$ as well as said perforations 6 and 7 to cover them. This film can be formed by putting the semiconductor wafer in a furnace maintained at a temperature of 750° C. and by introducing tetraethoxysilane into the furnace, thus forming a layer of $SiO_2$ having a thickness of about 5000 angstroms in 15 minutes.

(f) A photo-resistant or an acid-proof wax was applied onto the layer 8 except the perforation and areas closely adjacent thereto. The mask aligning operation at this stage is not required to be precise. The silicon substance was then etched for three minutes by a mixed solution of ammonium fluoride and hydrofluoric acid (mixing ratio being 6:1) to form an opening 9 through the layer 8 of $SiO_2$ formed by the pyrolysis of the silane and through said perforation 6 to each the region 4. It is desirable to make the diameter of the opening 9 larger than that of the perforation 6. By so dimensioning, the exposed area of the region 4 is defined by the diameter of the perforation 6 rather than by that of the opening. This is because the layer 8 of $SiO_2$ produced by the pyrolysis of silane can be more readily etched off than the layer 5 of $SiO_2$ produced by the high temperature oxidation process. Accordingly, as pointed out hereinbefore, the mask aligning operation for perforating the opening through the layer 8 of $SiO_2$ need not be very precise.

(g) An n-type impurity, phosphorus, for example, was introduced through the opening to form an n-type diffused region 10. Inasmuch as the layer 8 of $SiO_2$ formed by the pyrolysis of silane has a sufficient shielding effect against the impurity, diffusion of the impurity will not occur in the area of said perforation. Furthermore, as the impurity was diffused in an oxidizing atmosphere a thin oxide film 11 was formed simultaneously at an elevated temperature.

(h) The silicon wafer was immersed again in a mixed solution of ammonium fluoride and hydrofluoric acid (mixing ratio being 6:1) to chemically etch it for about five minutes. By this treatment, portions of the layer 8 of $SiO_2$ formed by the pyrolysis of silane and of the oxide layer 11 formed at an elevated temperature and covering the perforations 6 and 7 were removed to expose the areas of the n-type region 10 and of the p-type region 4 at the bottom of these perforations. In this regard, it should be particularly noted that no mask aligning operation is required in this step. On the other hand, in the prior art process precise mask aligning operations were required. In the step (g), if diffusion of the impurity were performed in an inert gas the oxide layer 11 would not be formed so that the time of chemical etching required to remove the layer 8 of $SiO_2$ obtained by the pyrolysis of silane could be reduced to only three minutes.

(i) Finally, electric conductive layers, for example, layers of aluminum 12 and 13 adapted to make ohmic connection to the regions 10 and 4, respectively, were formed by a well-known method. As many as 500 to 2000 such element structures can be formed on a single silicon wafer and these elements are then mechanically cut into separate pellets. Each of such individual pellets was then assembled on a stem, and lead wires were respectively connected to the conductive layers 14 and 15 via suitable connectors such as fine gold wires of about 30 microns.

Thus, a plurality of transistors were obtained each utilizing the region 1 as the collector, the region 4 as the base electrode and the region 10 as the emitter electrode.

*Example 2*

Another embodiment of this invention will be described by referring to FIG. 2.

(a) A p-type silicon single crystal layer 22 was grown on an n-type silicon substrate 21 by a well-known epitaxial technique. For example, the silicon substrate 21 was preheated to approximately 1200° C., and a gaseous mixture consisting of $H_2$ and $SiCl_4$ vapor was caused to flow over the surface of the preheated substrate so as to reduce $SiCl_4$ with $H_2$ to deposit silicon. The deposited silicon grew along the crystalline axis in the surface of the substrate. By incorporating the impurity into the gaseous mixture of $H_2$ and $SiCl_4$ in the form of a halide such as $BCl_3$, a semiconductor layer of the desired conductivity type was obtained. As the perfectness of the crystal in the epitaxially grown layer 22 depends upon the surface condition of the substrate 21, it is necessary to remove as far as possible contaminations, crystal defects, surface irregularities and the like present on the surface of the substrate 21 prior to causing the epitaxial growth. To this end it is preferable to subject the substrate to a vapor-phase etching operation prior to growth. The surface of a p-type grown layer thus formed was oxidized at an elevated temperature to form a layer 23 of $SiO_2$. The peripheral portion of the layer 23 of $SiO_2$ was then removed to expose the surface of the grown layer 22. The silicon substrate 21 was utilized as the collector electrode of a transistor.

(b) An n-type impurity was diffused into the substrate layer 21 through the peripheral surface of the grown layer 22 which was not covered by the layer 23 of $SiO_2$, thereby to form a p-type region 22 surrounded by an n-type diffused region 24. Since the diffusion of the impurity was effected in an oxidizing atmosphere, an oxide layer 25 of $SiO_2$ was also formed simultaneously at an elevated temperature. The p-type region 22 could be utilized as the base layer of a transistor.

(c) Similarly as in the step (d) of Example 1, perforations 26 and 27, corresponding to the perforation 6 and 7, respectively, were formed through the layers 23 and 25 of $SiO_2$ to expose portions of the surface of the p-type region.

(d) The subsequent steps were identical to those of Example 1. Thus, a layer 28 of $SiO_2$ formed by pyrolysis of a silane was deposited on the surface of the semiconductor, and an opening terminating at the region 22 was perforated through the $SiO_2$ layer 28 by way of the perforation 26. As has been mentioned in connection with Example 1, the diameter of the opening 29 should be larger than that of the perforations 26.

(e) An n-type impurity was diffused through the opening 29 to form a diffused region 30. Simultaneously, an oxide layer 31 of $SiO_2$ was formed at an elevated temperature. The region 30 could be utilized as the emitter region of a transistor.

(f) Portions of the layer 28 of $SiO_2$ formed by the pyrolysis of silane and of the layer 31 of $SiO_2$ formed by oxidation at an elevated temperature and covering the perforations 26 and 27 were removed by etching by a mixed solution of ammonium fluoride and hydrofluoric acid (mixing ratio being 6:1) to connect ohmic contacts 32 and 33 to the n-type region and the p-type region, respectively, through the respective perforations.

*Example 3*

FIG. 3 shows a modification of this invention as applied to the fabrication of a planar type transistor wherein all of the contacts to the various regions of a semiconductor element are in the same plane. The early stages of this modified process were the same as the steps (a) through (c) of Example 1. Thus, a p-type impurity was diffused into an n-type silicon substrate to form a p-type diffused region 4 by using a layer of $SiO_2$ as a mask, while at the same time a thin layer 5 of $SiO_2$ was formed to cover the region 4.

(a) While in Example 1, perforations 6 and 7 reaching the diffused layer 4 were formed to extend through the layer 5 of $SiO_2$, in the present example, a perforation 16 terminating at the surface of the n-type substrate 1 was formed through the layers of 5 and 2 of $SiO_2$. This perforation was used to form a collector electrode in the later stage of fabrication.

(b) In this step, as in Example 1, a film or layer 8 which can be etched at a higher rate than the layers 2 and 5 of $SiO_2$ and is effective to shield against diffusion of an active impurity was deposited on the assembly and an opening 9 reaching the diffused region by way of the perforation 6 was formed through the layer 8 while retaining perforations 7 and 16 covered by the layer 8.

(c) An n-type impurity was diffused into the p-type diffused region through said perforation 9 to form an n-type diffused region 10 acting as an emitter region. Concurrently with the diffusion of the impurity, a thin layer 11 of $SiO_2$ was formed.

(d) Portions of the layer 8 and the layer 11 of $SiO_2$ which cover said perforations 7 and 16 were removed to uncover them so as to expose the surfaces of the p-type diffused region 4 and of the n-type substrate 1. Thereafter, ohmic contacts 17, 18 and 19 connected to the respective regions were formed through the perforations 6, 7 and 16, respectively, said contacts 17, 18 and 19 serving as the collector, emitter, and base electrodes, respectively, of a transistor.

*Example 4*

FIG. 4 illustrates a modification of this invention as applied to the fabrication of a field effect transistor.

(a) A p-type silicon substrate 41 was prepared and its surface was oxidized at an elevated temperature to form a layer 42 of $SiO_2$ and perforations 43, 44 and 45 were formed through the layer 42, said perforations serving to form a second gate electrode, a source electrode, and a drain electrode, respectively. Perforations 44 and 45 were formed to extend in parallel.

(b) A layer 46 which can be more readily etched than the layer 42 of $SiO_2$ and is effective for shielding against the diffusion of an active impurity was deposited to cover the layer 42 of $SiO_2$ as well as the perforations 43 and 45, and the portion of the layer 46 covering the perforations 44 and 45 was removed to form an opening 47, thereby to expose the surface of the substrate.

(c) An n-type impurity was diffused through the perforations 44 and 45 to form an n-type drain and source regions 48 and 49. When this diffusion of the impurity is performed in an oxidizing atmosphere, a layer 50 of $SiO_2$ can be formed on the surface of the silicon substrate concurrently with the diffusion process.

(d) Portions of the layer 46 and of the layer 50 of $SiO_2$ which overlie perforations 43 to 45 were removed to uncover them, and ohmic contacts 51, 52 and 53 were made to respective regions through the respective perforations. Further, a layer of a first gate electrode 54 was formed on a layer of $SiO_2$ covering the silicon surface positioned between the source region 48 and the drain region 49.

It is well known in the art that, generally, electrons are accumulated in the semiconductor surface covered by a layer of $SiO_2$ to render it to exhibit n-type conductivity so that the surface of a p-type semiconductor underlying a layer of $SiO_2$ may be converted to n-type to form an n-type inverted layer. In the field effect type transistor fabricated in accordance with this example, this n-type inverted layer is utilized as a channel 55 between the source and drain regions.

While in the various examples illustrated hereinabove n-p-n type silicon transistors have been shown and described, it should be understood that this invention can be similarly applied with equal effectiveness to the fabrication of p-n-p type silicon transistors. Also, while in the above embodiments the process of forming oxide films which constitutes the essential process step of this invention was explained as the process of forming oxide layers by pyrolysis of tetraethoxysilane it should be understood that this invention is by no means limited to this particular process. Thus the oxide layer can also be formed by vapor depositing lead or lead oxide upon the silicon oxide film and then heating the assembly in an oxidizing atmosphere or by vapor depositing lead or lead oxide directly upon an exposed portion of the silicon substrate and then heating the assembly. Further, oxide films formed by depositing by a cathode reactive sputtering process with vapor of tetraethoxysilane and other gases in a manner well known in the art can also be used to carry out inventive process. Further, inasmuch as such films may be removed in the final process step, they are not required to have good insulating property, and any film may be used as long as it has sufficient shielding effect against impurities and can be readily etched. In addition, the semiconductor substrate is not limited to silicon, and any semiconductor such as GaAs, or elements included in groups III–V, and II–VI of the periodic table can be covered by depositing a protective film having different etching speed against chemical etchant and can be used to fabricate ultra-high-frequency transistors or solid-state circuits with a smaller number of mask aligning operations than the prior art process, in accordance with this invention.

In this case, for a protective film of different etching speed, a film obtained by any of the items No. 2 and No. 3 of the foregoing Table 1 can be used. The following Example 5 shows one embodiment in which germanium is used as a semiconductor substrate. Explanations are given in reference to FIG. 4 as in the case of Example 4.

*Example 5*

(a) A p-type germanium substrate 41 was prepared and its surface was coated with a layer 42 of $SiO_2$ having thickness of 5000 angstroms produced by pyrolysis of organooxysilanes and then perforations 43, 44 and 45 through the layer reaching the surface of the germanium substrate were formed, the said perforations serving to form a second gate electrode, a source electrode and a drain electrode, respectively, as is the case with Example 4. The perforations 44 and 45 were formed to extend in parallel.

(b) The entire surface of germanium substrate coated with layer 42 was again coated with another layer of $SiO_2$ having thickness of 1500 angstroms produced by pyrolysis of organooxysilanes and then a layer of lead was vapor-deposited with thickness of 400 angstroms. The whole coated substrate was heated for 30 minutes in an oxidizing atmosphere at a temperature of 600° C. By this treatment, a glass layer 46 of about 2300 angstrom thick consisting of solid-solution of $SiO_2$ and PbO were formed on the germanium substrate. Under this layer 46, the layer 42 of $SiO_2$ having perforations 43, 44 and 45 remained. Next, same as Example 4, the portion of the layer 46 covering the perforations 44 and 45 was removed to form an opening 47, thereby exposing the surface of the germanium substrate. When a mixture etchant comprising ammonium fluoride and hydrofluoric acid (mixing ratio being 6:1) is used as etching solution, the time required to etch the glass layer 46 to form the opening 47 was about 20 seconds.

(c) An n-type impurity was diffused through the perforations 44 and 45 to form an n-type drain and source regions 48 and 49. In the case of germanium substrate, the temperature necessary for diffusion of the impurity is 500 to 900° C., which is considerably lower than the oxidizing temperature of silicon, i.e., 1000° C. and above. On account of this, in the course of the diffusion of the impurity, the surface of the germanuim substrate was not almost oxidized. Consequently, the layer 50 as shown in FIG. 4(*c*) was not formed effectively in the case of the germanium substrate.

(d) The portions of the glass layer 46 which overlie the perforations 43, 44 and 45 were removed by etching for about 20 seconds with the abovementioned etching solution so that the perforations can be again exposed. Then, ohmic contacts 51, 52, and 53 were made to respective regions through the respective perforations. Further, a first gate electrode 54 was formed on the layer 42 of $SiO_2$.

Silicon oxide films obtained by the pyrolysis of tetraethoxysilane and utilized in this invention have the same shielding effect against active impurities as the silicon oxide prepared by the conventional process of oxidizing at elevated temperatures and yet can be etched at a higher rate by a liquid mixture of ammonium fluoride and hydrofluoric acid (mixing ratio being 6:1) or by hydrofluoric acid only. Moreover, as such oxide films can be formed at a relatively low temperature, the active impurity which is introduced into the semiconductor substrate prior to the process step of forming oxide films is not diffused again at the time of depositing the oxide films, whereby the distribution of the active impurity is maintained unchanged.

While in the foregoing examples, layers of $SiO_2$ formed at an elevated temperature above 1000° C. were utilized as the oxide film which is difficult to etch, oxide films having the same degree of resistance of etching can be obtained by oxidizing the surfaces of silicon bodies in a high pressure oxidizing atmosphere at a relatively low temperature. Thus, for example, when a silicon body is continuously subjected to a steam atmosphere maintained at a pressure of 120 atmospheres and at a temperature of 650° C. for one hour, a layer of $SiO_2$ of a thickness of about 5000 angstroms is formed. For this reason, when this invention is applied to the fabrication of planar type silicon transistors, it is possible to reduce the number of position aligning operations for the emitter and base regions, which are required to be extremely accurate, to only one (the conventional process requiring at least two). Accordingly, it is possible not only to make the characteristic of the semiconductor element uniform throughout the entire surface thereof but also to greatly decrease the percentage of rejects. This contributes to great reduction of the manufacturing cost of the elements and to improvement of mass producibility of micro transistors and solid state circuits.

While the invention has been explained by describing particular embodiments thereof, it will be apparent that improvements and modifications may be made without departing from the scope of the invention as defined in the appended claims.

What we claim is:

1. A method of fabricating a semiconductor device comprising the steps of:

(a) forming a first electric insulator film on the surface of a semiconductor substrate;

(b) forming a plurality of perforations through said film, said perforations terminating at the surface of said substrate;

(c) depositing a second film on said first insulator film to cover it and portions of the surface of said substrate which have been exposed by said perforations, said second film having a higher rate of etching by the same etchant than said insulator film and being effective for shielding against diffusion of active impurities;

(d) forming at least one opening through said second film, said opening terminating at the surface of said substrate by way of at least one of said perforations, extending through said insulator film while the remaining perforations are still covered by said second film;

(e) selectively diffusing an active impurity into said semiconductor substrate through said opening extending through said second film; and (f) removing said second film to reestablish said perforations through said insulator film, thereby to reexpose portions of the surface of said substrate through said perforations.

2. A method of fabricating a semiconductor device comprising the steps of:

(a) oxidizing the surface of a silicon substrate heated to an elevated temperature by exposing said surface to an oxidizing atmosphere so as to form a first film of silicon dioxide on said substrate surface;

(b) forming a plurality of perforations through said silicon dioxide film, said perforations terminating at the surface of said substrate;

(c) depositing a second film on said first silicon dioxide film to cover it and portions of the surface of said substrate which have been exposed by said perforations, said second film having a higher rate of etching by the same etchant than said first silicon dioxide film and being effective for shielding against diffusion of active impurities;

(d) forming at least one opening through said second film, said opening terminating at the surface of said substrate by way of at least one of said perforations extending through said first silicon dioxide film while the remaining perforations are still covered by said second film;

(e) selectively diffusing an active impurity into said semiconductor substrate through said opening extending through said second film; and (f) removing said second film to reestablish said perforations through said silicon dioxide film, thereby to reexpose portions of the surface of said substrate through said perforations.

3. A method of fabricating a semiconductor device comprising the steps of:

(a) depositing a layer of silicon dioxide over the surface of a germanium substrate heated to an elevated temperature by exposing the said surface to an oxidizing atmosphere so as to form a first layer on the said substrate surface;

(b) forming a plurality of perforations through the said silicon dioxide layer, said perforations terminating at the surface of the said substrate;

(c) depositing a second oxide layer over the said first silicon dioxide layer and the portions of the surface of the said substrate which have been exposed by the said perforations, the said second oxide layer having a higher rate of etching by the same etchant than the said first silicon dioxide layer and moreover being effective for shielding diffusion of active impurities;

(d) forming at least one opening through the said second oxide layer, the said opening terminating at the surface of the said substrate by way of at least one of the said perforations extending through the said first silicon dioxide layer while the remaining perforations are still covered by the said second oxide layer;

(e) selectively diffusing an active impurity into the said semiconductor substrate through the said opening extending through the said second oxide layer; and (f) removing the said second oxide layer to reestablish the said perforations formed previously through the said silicon dioxide layer, thereby reexposing the portions of the surface of the said substrate through the said perforations.

4. A method of fabricating a semiconductor device comprising the step of:

(a) forming a first insulator film on the surface of a substrate consisting of a semiconductor body of one conductivity type;

(b) forming a perforation through said insulator film, said perforation terminating at the surface of said substrate;

(c) selectively diffusing through said perforation an impurity of a conductivity type different from that of said substrate to form a diffused region of different conductivity type, thereby to cause the exposed portion of a p-n junction formed between said substrate and said diffused region to extend beneath said first insulator film;

(d) forming a second insulator film upon said diffused region to cover said perforation;

(e) forming two openings through said second insulator film said openings terminating at said diffused region;

(f) depositing a third film to cover said first and second insulator films as well as said two openings, said third film consisting of a substance having a higher rate of etching by the same etchant than said first and second insulator films and being effective for shielding against diffusion of active impurities;

(g) forming an opening through said third film by way of one of said two openings extending through said second film, said opening terminating at said diffused region while the other of said two openings are still covered by said third film;

(h) selectively diffusing through said opening in said third film an impurity of the said conductivity type as said substrate into said diffused region to form another diffused region of said one conductivity type, thereby to cause the exposed portion of a p-n junction formed between said region of different conductivity type and said diffused region of said one conductivity type to extend beneath said second film; and (i) removing said third film to reestablish the other of said two openings thereby to again expose a portion of the surface of said diffused region of different conductivity type.

5. The method of fabricating a semiconductor device according to claim 4 wherein said semiconductor substrate is made of silicon, and wherein said first and second insulator films are layers of silicon dioxide which are formed by oxidizing the surface of said silicon substrate at an elevated temperature.

6. A method of fabricating a semiconductor device comprising the steps of:

(a) forming a first insulator film upon the surface of a substrate consisting of a semiconductor body of one conductivity type;

(b) forming a perforation which terminates at the surface of said substrate through said first insulator film;

(c) selectively diffusing through said perforation an impurity of a conductivity type different from that of said substrate to form a diffused region of different conductivity type, thereby to cause the exposed portion of a p-n junction formed between said substrate and said diffused region to extend beneath said first insulator film;

(d) forming a second insulator film on said diffused region to cover said perforation;

(e) forming one opening terminating in said substrate region of said one conductivity type through said first insulator film and forming two openings terminating in said diffused region through said second insulator film;

(f) depositing a third film to cover said first and second insulator films as well as said openings, said third film being made of a substance having a higher rate of etching by the same etchant than said first and second insulator films and being effective for shielding against diffusion of active impurities;

(g) forming an opening that reaches said diffused region through said third film by way of one of said two openings perforated through said second insulator film, while maintaining the other of said two openings and said perforation through said first insulator film still covered by said third film;

(h) selectively diffusing through said opening extending through said third film an impurity of the same conductivity type as said substrate into said diffused region to form another diffused region of said one conductivity type, thereby to cause the exposed portion of a p-n junction formed between said region of different conductivity type and said diffused region of said one conductivity type to extend beneath said second film; and (i) removing said third film to reestablish said one opening through said first film as well as said other of said two openings through said second film to expose again portions of the surfaces of said substrate of said one conductivity type and of said diffused region of said different conductivity type.

7. The method of fabricating a semiconductor device according to claim 6 wherein said semiconductor substrate is made of silicon, and said first and second insulator films are layers of silicon dioxide formed by oxidizing the surface of said silicon substrate at an elevated temperature.

References Cited

UNITED STATES PATENTS

| | | | |
|---|---|---|---|
| 2,995,473 | 8/1961 | Levi. | |
| 3,158,505 | 11/1964 | Sandor | 148—179 X |
| 3,226,613 | 12/1965 | Haenichen | 148—33 X |
| 3,281,915 | 12/1966 | Schramm | 148—187 X |

HYLAND BIZOT, *Primary Examiner.*